United States Patent

[11] 3,586,928

[72] Inventors Gerald David Bergman
Bushey Heath;
Tony Charles Denton, Watford, both of, England

[21] Appl. No. 754,134
[22] Filed July 25, 1968
[45] Patented June 22, 1971
[73] Assignee U. S. Philips Corporation
New York, N.Y.
[32] Priority Aug. 9, 1967
[33] Great Britain
[31] 36514/67

[54] INTEGRATED TRANSVERSE AND TRIGGERING LATERAL THYRISTORS
4 Claims, 14 Drawing Figs.

[52] U.S. Cl. .................... 317/235R, 317/235 AB, 317/235 Y, 317/235 D, 317/235 T, 317/235 E
[51] Int. Cl. .................... H01l 19/00, H01l 11/10
[50] Field of Search .................... 317/235/41.1, 235/40.12, 235, 235/22.1, 235/22, 235/22.2, 235/40.12, 234, 235/30

[56] References Cited

UNITED STATES PATENTS

| | | | |
|---|---|---|---|
| 3,486,085 | 12/1969 | Slavin | 317/235 |
| 3,475,666 | 10/1969 | Hutson | 317/235 |
| 3,435,515 | 4/1969 | Kurpisz | 29/580 |

FOREIGN PATENTS

| | | | |
|---|---|---|---|
| 1,418,640 | 10/1965 | France | 317/235 |

*Primary Examiner*—John W. Huckert
*Assistant Examiner*—Martin H. Edlow
*Attorney*—Frank R. Trifari ABSTRACT: An integrated switching system is described comprising transverse and lateral thyristors, the latter being connected to trigger or turn on the transverse thyristor. Both thyristors are made in the same wafer by a planar process, the additional lateral thyristor being made simultaneously with regions of the transverse thyristor thereby minimizing additional processing steps.

INVENTOR.
TONY C. DENTON
BY GERALD D. BERGMAN
AGENT

INVENTOR.
TONY C. DENTON
BY GERALD D. BERGMAN
Frank R. Trifari
AGENT

INVENTOR.
TONY C. DENTON
BY GERALD D. BERGMAN
Frank R. Trifari
AGENT

INVENTOR.
TONY C. DENTON
BY GERALD D. BERGMAN
Frank R. Trifari
AGENT

INVENTOR.
TONY C. DENTON
BY GERALD D. BERGMAN
Frank R. Trifari
AGENT

INVENTOR.
TONY C. DENTON
BY GERALD D. BERGMAN
AGENT

INVENTOR.
TONY C. DENTON
BY GERALD D. BERGMAN
Frank R. Trifari
AGENT

INTEGRATED TRANSVERSE AND TRIGGERING LATERAL THYRISTORS

This invention relates to a semiconductor integrated circuit comprising a semiconductor body having a transverse thyristor formed by first, second, third and fourth successively arranged regions of alternating conductivity type extending between opposite major surfaces of the body and defining three PN junctions therebetween, two main current carrying electrodes, one in ohmic contact with the first region at one major surface and the other in ohmic contact with the fourth region, whereby a main current path is provided between said electrodes through the transverse thyristor formed by said four regions and said three PN junctions.

Semiconductor devices comprising a semiconductor body having four successively arranged regions alternating conductivity type defining three PN junctions therebetween and electrodes on the outer two regions are known. Such two-terminal devices may be referred to as diode thyristors. A further development of such devices is the gate controlled thyristor in which a third, gate electrode is present on one of the two intermediate regions. These devices may be referred to as triode thyristors. In the operation of these devices a relatively small voltage applied at the gate electrode can switch the device from a high impedance, nonconductive state to a low impedance, conductive state when a suitable forward voltage is applied between the electrodes on the outer two regions. A small current applied to the gate electrode initiates the flow of a much greater current through the device between the main current carrying electrodes on the outer two regions. These devices are unidirectional in that with alternating current applied across the main current carrying electrodes the device can exist in the low impedance, conductive state only in one half cycle of the applied alternating current.

There are various particular configurations of the four region diode and triode thyristors and various different methods are employed in their manufacture. One such configuration is the so called 'planar' thyristor. In this device the semiconductor body has at least one substantially plane major surface, the first region is a diffused region of the one conductivity type extending in the body from the one surface and is surrounded within the body by the second region of the opposite conductivity type with the PN junction therebetween terminating at the surface, the second region of the opposite conductivity type is a diffused region extending in the body from the one surface and is surrounded within the body by the third region of the one conductivity type with the PN junction therebetween terminating at the one surface. A first main current carrying electrode is in low resistance ohmic contact with the first region at an exposed surface portion thereof and a second main current carrying electrode is in low resistance ohmic contact with a surface portion of the fourth region. In the triode thyristor a gate electrode is in low resistance ohmic contact with the second region at an exposed surface portion thereof. The planar thyristor is manufactured by the known techniques of the planar process which involves the steps of oxide masking, photoengraving, diffusion, metallization etc. This process permits a plurality of thyristor units to be produced simultaneously on a single wafer of semiconductor material, the semiconductor bodies of individual devices being obtained from the wafer by dicing at a stage in manufacture after the diffusions and metallization have been carried out. In the manufacture of a silicon planar thyristor the starting material may be an N-type wafer of silicon. So called P-type isolation diffusions are carried out such that a P-type grid extends completely through the body and defines the areas at which the individual thyristors are to be formed. The P-type isolation diffusion may be effected in a two-stage process, the P-type second and fourth regions being formed simultaneously during the second stage. The P-type second region is located between the grid extending to a limited surface area of one plane surface of the wafer. This is achieved by providing an insulating masking layer on the one surface having an opening therein exposing a portion of the surface into which the impurity is diffused. The opposite surface is not masked and the P-type fourth region is formed extending across the opposite surface contiguous with the P-type isolation diffusion grid. The N-type first region is subsequently formed within the previously formed P-type second region by diffusion of a donor impurity into a limited portion of the one surface exposed by a further opening in the insulating layer.

Planar thyristors have applications, for example, in the speed control of small motors employed in domestic appliances. To obtain the desired control additional circuitry has to be provided in combination with the thyristor. A commonly employed DC motor speed control circuit employs a gate controlled thyristor (triode thyristor) in series with the motor and supply with a trigger circuit which is responsive to the motor speed connected to the gate. A simple trigger circuit may comprise an auxiliary diode thyristor in series with the gate of the main triode thyristor. Another circuit comprises a transistorized blocking oscillator trigger unit which triggers the gate of the main triode thyristor. In another circuit the DC motor is connected in series with a triode thyristor across the AC supply, a variable resistor being connected in parallel with the motor and thyristor, the gate of the triode thyristor being connected to a set point on a variable resistor. Triggering of the thyristor is according to the voltage difference between the set point and the feedback speed voltage generated by the armature of the motor appearing at the cathode of the thyristor. To prevent current flowing through the motor windings via the gate of the thyristor when the thyristor is in the nonconductive state and the voltage at the set point is more negative with respect to the feedback speed voltage generated by the armature of the motor appearing at the cathode than the reverse breakdown voltage between the gate and cathode, a safety diode is connected between the gate and the set point on the variable resistor.

It is recognized that the complexity of the necessary additional circuitry increases the cost of using thyristor motor speed control systems in domestic appliances. This invention is based on the recognition, inter alia, that by simple modifications of the processing employed in the manufacture of a planar type of thyristor, various integrated circuits comprising a thyristor and including at least one of the active circuit components of the additional triggering circuitry required when a thyristor is used, for example in motor speed control can be manufactured at a cost for such an integrated circuit which is not significantly greater than that of a single planar thyristor.

According to the invention, a semiconductor integrated circuit comprises a semiconductor body having a transverse thyristor formed by first, second, third and fourth successively arranged regions of alternating conductivity type extending between opposite major surfaces of the body and defining three PN junctions therebetween, two main current carrying electrodes, one in ohmic contact with the first region at one major surface and the other in ohmic contact with the fourth region, whereby a main current path is provided between said electrodes through the transverse thyristor formed by said four regions and said three PN junctions, is characterized in that a triggering, lateral thyristor is provided which is associated with one of the outer regions of said four regions and formed by four successively arranged regions of alternating conductivity type constituted by the said outer region, the next adjacent region in the main current path, and two further regions of which the first further region extends to the one major surface, and is surrounded within the body by the second further region, and in that a control electrode is provided in ohmic contact with the first further region at the one major surface, whereby a lateral, triggering current path extending substantially parallel to the one major surface is provided through the lateral thyristor for switching the transverse thyristor from a high-impedance, nonconductive state to a low-impedance, conductive state at a suitable applied voltage on the control electrode with respect to the applied voltage on the main current carrying electrode in ohmic contact with the said one outer region.

By the suitable positioning of the two further regions in the body with respect to the four regions of the transverse thyristor various configurations of a semiconductor integrated circuit are possible as will be described fully hereinafter. However, these circuits may be classified broadly into two main groups, one in which the lateral thyristor is associated with the first region of the transverse thyristor and the other in which the lateral thyristor is associated with the fourth region of the transverse thyristor.

In preferred constructions of semiconductor integrated circuits according to the invention the first PN is a diffused region of one conductivity type (N or P) extending in the body from the one major surface and is surrounded in the body by the second region which is of the opposite conductivity type (P or N), the second region being a diffused region which extends in the body from the one major surface and is surrounded within the body by the third region which is of the one conductivity type (N or P) whereby the PN junction between the first and second regions and the PN junction between the second and third regions both terminate at the one major surface. These constructions embody the features of the so-called "planar" thyristor as hereinbefore described.

In one preferred form of such a planar construction the third region which is of the one conductivity type (N or P) is surrounded within the body by the fourth region which is of the opposite conductivity type (P or N) with the PN junction therebetween terminating at the one major surface and the lateral thyristor is associated with the fourth region, the first further region and the second further region being diffused regions of the one conductivity type (N or P) and of the opposite conductivity type (P or N) respectively, the second further region being surrounded within the body by the third region with the PN junction therebetween terminating at the one major surface. As an example of such a circuit, if the first, second, third and fourth regions are of N-type, P-type, N-type and P-type respectively, the lateral thyristor is associated with the fourth, P-type region and the main current carrying electrode in ohmic contact with this region is the anode of the transverse thyristor. The triggering current path is formed extending substantially parallel to the one major surface through the four regions constituting the lateral thyristor, one of the outer regions of which is the fourth region of the transverse thyristor where said fourth region extends to the one major surface.

The main current carrying electrode in ohmic contact with the fourth region of the transverse thyristor will generally be situated at the major surface of the body opposite the said one major surface. This provides for suitable heat dissipation from the transverse thyristor and also serves to support the semiconductor in the oncapsulation used. However, it is possible, for example, in some low current integrated circuits according to the invention to locate the main current carrying electrode, which is in ohmic contact with the fourth region, at the one major surface where this region extends to said surface.

In the aforesaid preferred form of the planar construction of the integrated circuit the first further region and the second further region respectively may have the same impurity concentration profiles as the first and second regions and have been formed simultaneously with the first region and the second region respectively by the diffusion of an impurity element characteristic of the one conductivity type (N or P) and by diffusion of an element characteristic of the opposite conductivity type (P or N) respectively into limited surface portions of the one major surface of the body. It will be apparent that such an integrated circuit may be manufactured in a similar manner to the manufacture of a planar type of thyristor, as hereinbefore described, by suitable modification of the photoprocessing steps required to expose surface portions of the body prior to the diffusion of an element characteristic of the opposite conductivity type (P or N) and prior to the diffusion of an impurity element characteristic of the one conductivity type (N or P) into the one major surface of the body, that is, by suitable modification of the masks used in the exposure of a photoresist layer provided on an insulating layer on the one major surface. Thereafter at a later stage of manufacture the control electrode is provided on the surface portion of the first further region, which is of the one conductivity type (N or P) whereas in the manufacture of a planar type of thyristor the control electrode corresponds to the gate electrode which would be provided on the second region. Thus the manufacture of such an integrated circuit does not necessarily involve additional diffusion steps and it will be apparent that by modification of the manufacture described it is feasible to produce a semiconductor integrated circuit according to the invention which includes a transverse thyristor and a triggering lateral thyristor at a cost which is not substantially greater than the cost of manufacture of a single planar thyristor.

The aforesaid preferred form of the planar construction of the integrated circuit may additionally comprise a third further region which is a diffused region of the one conductivity type (N or P), extends in the body from the one major surface and is surrounded within the body by the second further region which is of the opposite conductivity type (P or N) with the PN junction therebetween terminating at the one surface, said third further region of the one conductivity type (N or P) being electrically connected to the fourth region thereby to provide an integrated Zener diode between the main current carrying electrode in ohmic contact with the fourth region and the second further region which is of the opposite conductivity type (P or N) to stabilize the turn-on voltage of the lateral thyristor. In such a circuit the first further region and the third further region may have the same impurity concentration profiles and have been formed simultaneously with the first region by the diffusion of an element characteristic of the one conductivity type (N or P) into limited surface portions of the one major surface of the body.

Such an integrated circuit including a stabilizing Zener diode may comprise an insulating layer present on the one surface, openings in the insulating layer where the first region which is of the one conductivity type (N or P) and the first further region which is of the one conductivity type (N or P) extend to the one surface containing metal layer ohmic contacts to these regions, said contacts constituting the first main current carrying electrode and the control electrode respectively, a further opening in the insulating layer where the third further region which is of the one conductivity type (N or P) extends to the one surface containing a metal layer which forms an ohmic contact to this region and further extends over the insulating layer into a further opening where the fourth region extends to the one surface and forms contact therewith.

In a second preferred form of the planar construction of an integrated circuit according to the invention previously referred to, the lateral thyristor is associated with the first region, the first further region and second further region being diffused regions of the opposite conductivity type (P or N) and of the one conductivity type (N or P), respectively, the second further region being surrounded within the body by the second region which is of the opposite conductivity type (P or N) with the PN junction therebetween terminating at the one major surface. As an example of such an integrated circuit, if the first, second, third and fourth regions are of N-type, P-type, N-type and P-type respectively, the lateral thyristor is associated with the first, N-type region and the main current carrying electrode in ohmic contact with this region is the cathode of the transverse thyristor. The triggering current path is formed extending substantially parallel to the one major surface through the four regions constituting the lateral thyristor, one of the outer regions of which is the first region of the transverse thyristor.

In the said second preferred form of the planar construction of the integrated circuit the third region which is of the one conductivity type (N or P) may be surrounded within the body by the fourth region which is of the opposite conductivity type (P or N) with the PN junction therebetween terminating at the one major surface. The main current carrying electrode in ohmic contact with the fourth region of the thyristor will generally be situated at the major surface of the body opposite the said one major surface as has been previously described with respect to the first preferred form of the planar construction of the integrated circuit.

In the said second preferred form of the planar construction of the integrated circuit a third further region, which is a diffused region of the opposite conductivity type (P or N) may be present, said third further region extending in the body from the one major surface and surrounded in the body by the second further region which is of the one conductivity type (N or P) with the PN junction therebetween terminating at the one major surface, said third further region being electrically connected to the main current carrying electrode in ohmic contact with the first region thereby to provide an integrated Zener diode between said main current carrying electrode and the second further region which is of the one conductivity type (N or P) to stabilize the turn-on voltage of the lateral thyristor. Such an integrated circuit may comprise an insulating layer present on the one major surface, openings in the insulating layer where the first region which is of the one conductivity type (N or P) and the first further region which is of the opposite conductivity type (P or N) extend to the one surface containing metal layer ohmic contacts to these regions, said ohmic contacts constituting the first main current carrying electrode and the control electrode respectively, a further opening in the insulating layer where the third further region which is of the opposite conductivity type (P or N), extends to the one surface containing a metal layer forming ohmic contact to this region and further extending over the insulating layer in contact with the metal layer ohmic contact to the first region.

Embodiments of the invention will now be described, by way of example with reference to the accompanying diagrammatic drawings, in which.

Figures 7, 14:
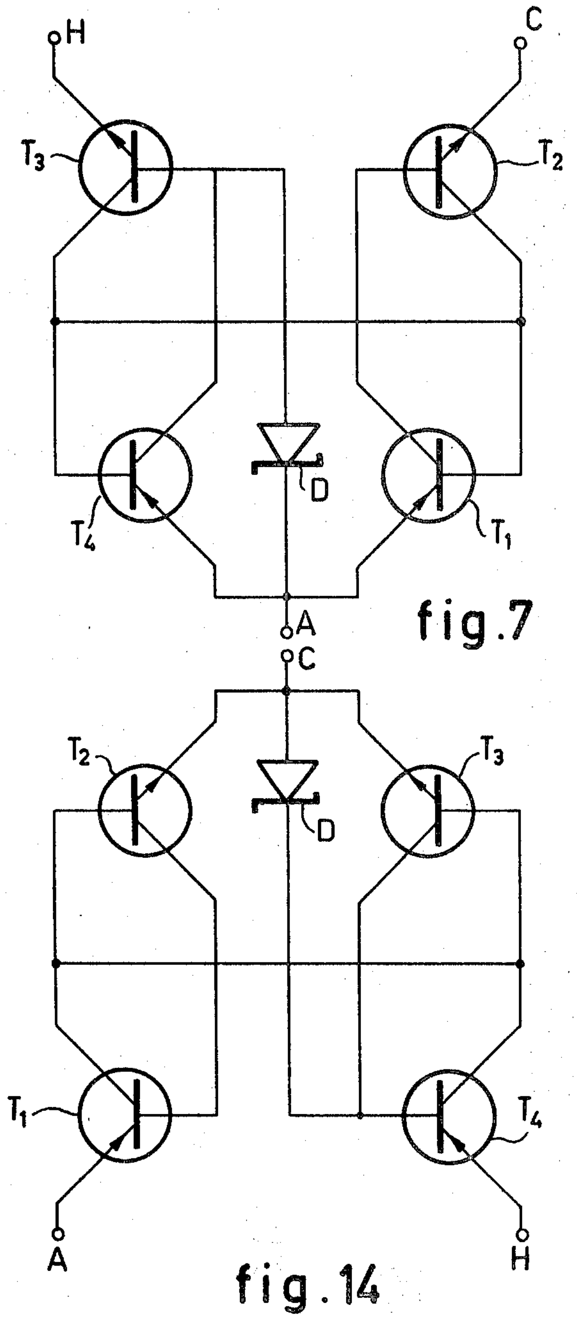
FIG. 7 is a representation of the equivalent circuit of the semiconductor integrated circuit shown in FIGS. 5 and 6.
Figure 8:
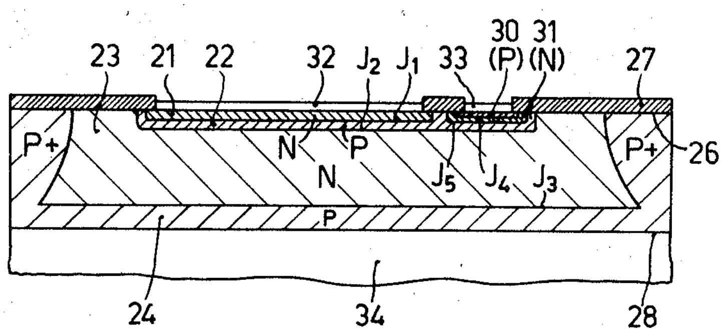
FIGS. 8 and 9 show in section and plan view respectively the semiconductor body of another semiconductor integrated circuit according to the invention.
Figure 9:
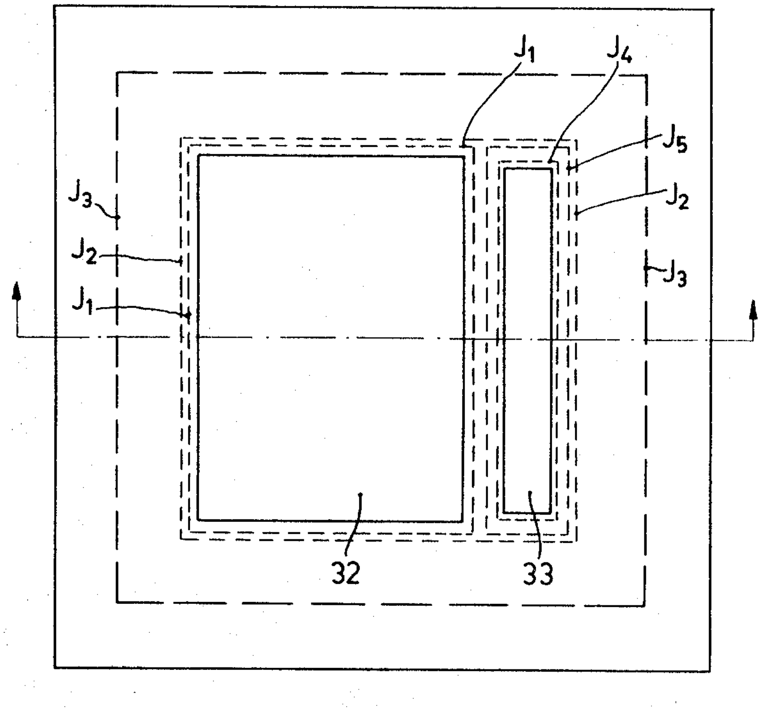
Figure 12:
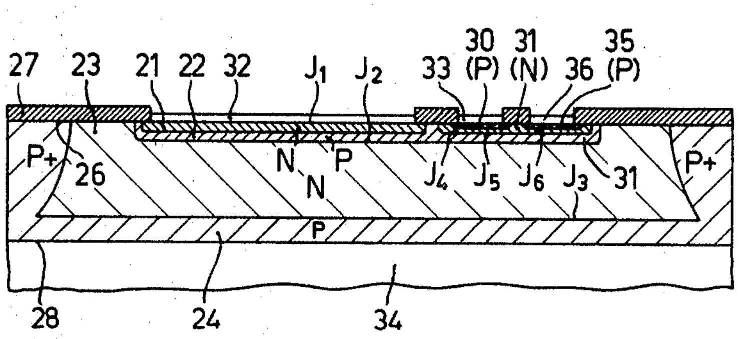
Figure 13:
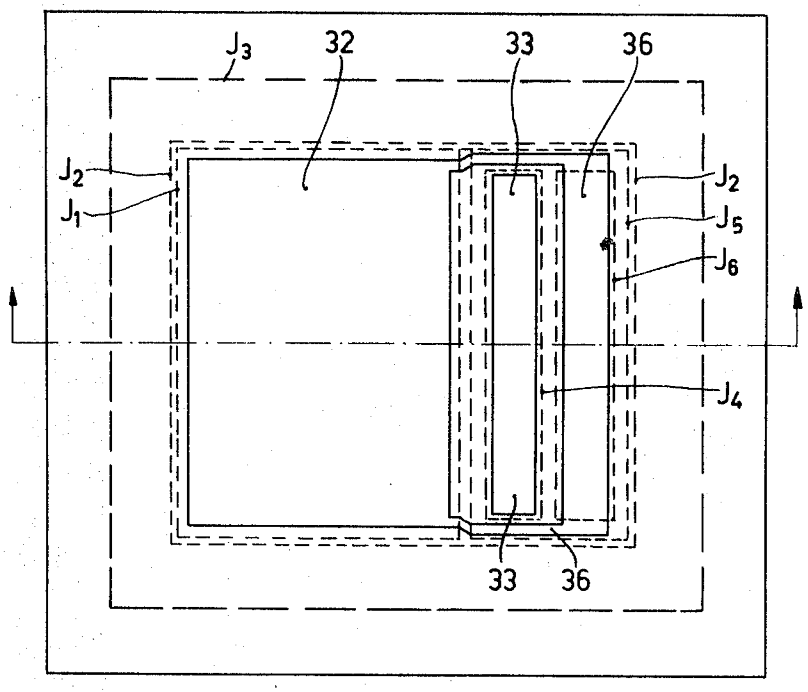

FIGS. 12 and 13 show in section and plan view respectively the semiconductor body of a semiconductor integrated circuit which is a modification of the semiconductor integrated circuit shown in FIGS. 8 and 9; and FIG. 14 is a representation of the equivalent circuit of the semiconductor integrated circuit shown in FIGS. 12 and 13.

Figure 1:
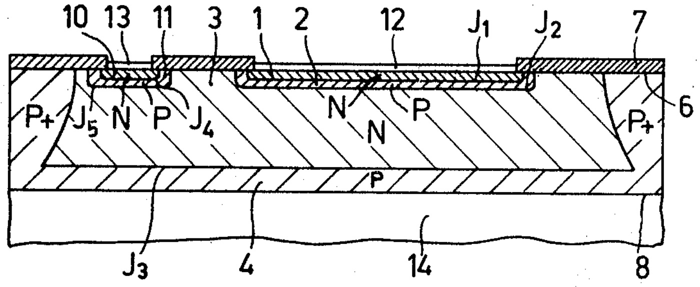
FIGS. 1 and 2 show in section and plan view respectively the semiconductor body of a semiconductor integrated circuit according to the invention.

The semiconductor integrated circuit shown in FIG. 1 comprises a semiconductor body of silicon having a first, N-type region 1, a second P-type region 2, a third, N-type region 3 and a fourth, P-type region 4, extending between opposite major surfaces of the body and defining PN junctions $J_1$, $J_2$ and $J_3$ therebetween. The semiconductor body has a substantially plane surface 6 having an adherent protective insulating layer 7 of silicon oxide thereon. The first, N-type region 1 is a diffused region and is surrounded within the body by the second, P-type region 2 which is also a diffused region, The PN junction $J_1$ between the first and second regions terminates at the surface 6 below the silicon oxide layer 7. The second, P-type region 2 is surrounded within the body by the third, N-type region 3, the PN junction $J_2$ between these regions also terminating at the surface 6 below the silicon oxide layer 7. The fourth, P-type region 4 is a diffused region and extends in the body from the opposite substantially plane surface 8. The region 4 further extends to the surface 6 at the periphery of the body such that the PN junction $J_3$ between the third and fourth regions 3 and 4 respectively also terminates at the surface 6 below the silicon oxide layer 7. A first further region 10 which is a diffused N-type region extends in the body from the surface 6 and is surrounded within the body by a second further region 11 which is a diffused P-type region with the PN junction $J_4$ between these regions also terminating at the surface 6 below the silicon oxide layer 7. The P-type region 11 extends to the surface 6 and is surrounded within the body by the third, N-type region 3 with the PN junction $J_5$ between these regions also terminating at the surface 6 below the silicon oxide layer 7. The junction $J_5$ is spaced from the part of the junction $J_3$ where it terminates at the surface 6 by a distance of approximately 40 microns. In the insulating layer 7 there are openings exposing the first, N-type region 1 and the first further N-type region 10 where these regions extend to the surface 6. The openings contain aluminum layers 12 and 13 which form low resistance ohmic contacts with the regions 1 and 10 respectively. The semiconductor body is mounted with the surface 8 secured to a metal support 14 which forms a low resistance ohmic contact to the fourth, P-type region 4.

Figure 2:
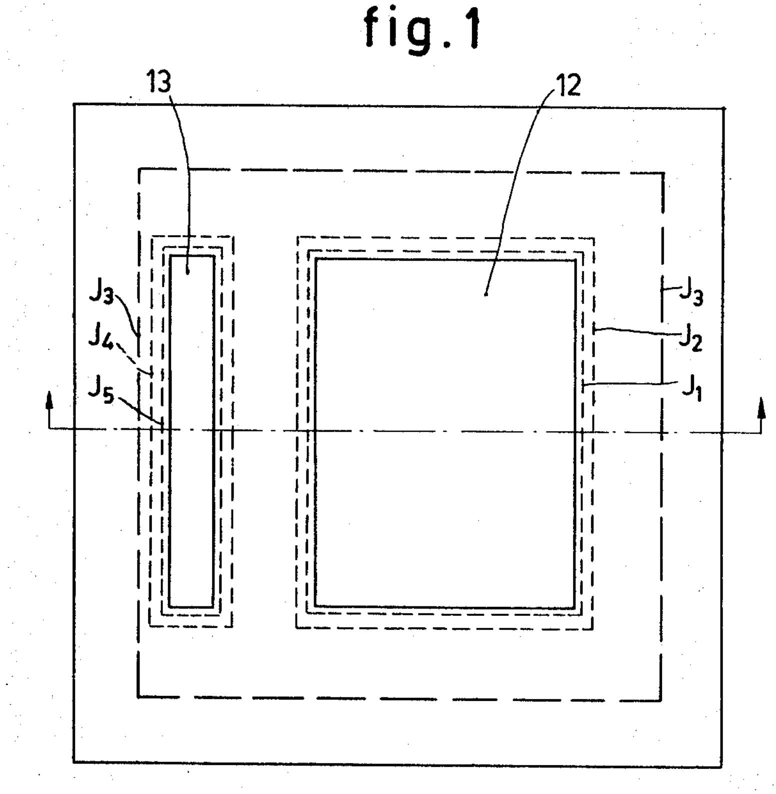

The dimensions of the semiconductor body and the various regions shown in FIGS. 1 and 2 are as follows:

The body is of 2.0 mm. × 2.0 mm. ×180 microns thickness. The N-type region 3 has a resistivity of approximately 25 ohm-cm. and its area extending at the surface 6 is 1.60 mm. × 1.60 mm. The P-type region 4 has been formed by a two-stage boron diffusion process and the surface concentration at the surfaces 6 and 8 is $10^{19}$ atoms/cc. The junction $J_3$ is at a distance from the surface 8 of 30 microns. The junctions $J_2$ and $J_5$ extend substantially parallel to the surface 6 at a distance therefrom of 30 microns. The P-type regions 2 and 11 have the same boron impurity concentration profiles and the surface concentration is $10^{18}$ atoms/cc. The P-type region 2 has an area at the surface 6 of 0.90 mm. × 1.20 mm. and the P-type region 11 has an area at the surface 6 of 260 microns × 120 mm. The junction $J_5$ is spaced from the junction $J_3$ where these junctions terminate at the surface 6, along one side of the P-type region 11, by a distance of approximately 40 microns. The adjacent parts of the junctions $J_5$ and $J_2$ where these junctions terminate at the surface 6 are space by a distance of 200 microns. The N-type region 10 has an area at the surface 6 of 180 microns × 1.12 mm. and the aluminum contact layer 13 has an area of 140 microns × 1.08 mm. The N-type region 1 has an area at the surface 6 of 0.85 mm. × 1.10 mm. and the aluminum contact layer 12 has an area of 0.80 mm. × 1.05 mm. The N-type regions 1 and 10 have the same phosphorus impurity concentration profiles with the junctions $J_1$ and $J_4$ extending at a distance of 15 microns from the surface 6. The phosphorus surface concentration in the regions 1 and 10 is $5 \times 10^{20}$ atoms/cc. The aluminum layers 12 and 13 have a thickness of approximately 1 micron and the silicon oxide layer 7 has a maximum thickness of approximately 2 microns although it will be appreciated that various parts of the layer 7 will have different thicknesses arising from the normal planar diffusion techniques.

Figures 3, 4:
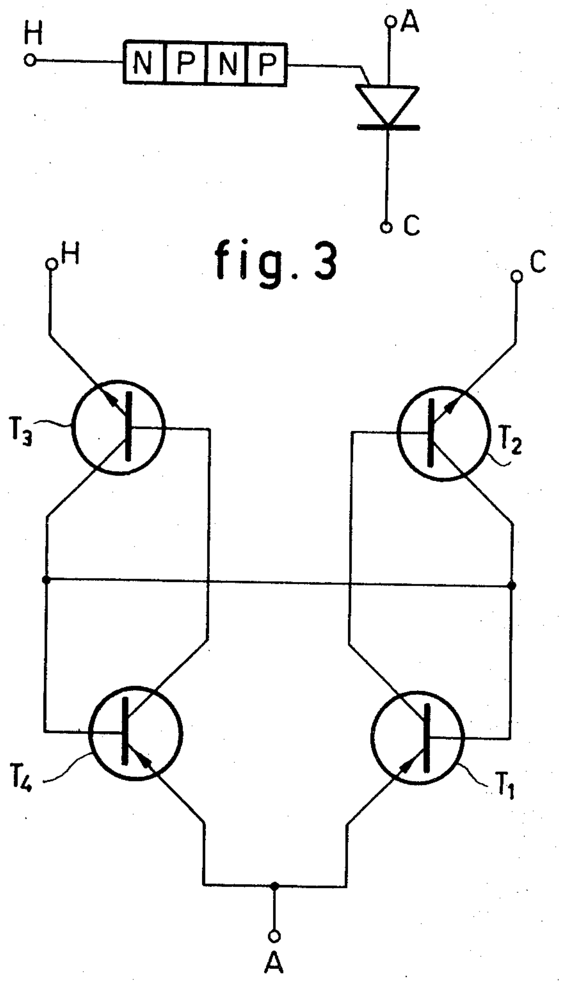
FIG. 3 is a schematic form of the semiconductor integrated circuit shown in FIGS. 1 and 2.
FIG. 4 is a representation of the equivalent circuit of the semiconductor integrated circuit shown in FIGS. 1 and 2.

The regions 1, 2, 3, 4 between the contacts 12 and 14 and the three PN junctions $J_1$, $J_2$, $J_3$ therebetween constitute the main current path of a transverse thyristor, the contacts 12 and 14 constituting the main current carrying electrodes and respectively constituting the cathode and the anode of the transverse thyristor. In a normal planar type of thyristor the gate electrode would be provided on the region 2 but in the integrated circuit shown in FIGS. 1 and 2 there is no external contact to the region 2, the ohmic contact 13 on the N-type region 10 constituting a control electrode. A lateral thyristor is present which is associated with the fourth, P-type region 4 and is constituted by the four successively arranged regions of alternating conductivity type near the surface 6 consisting of the N-type region 10, the P-type region 11, the N-type region 3 and the P-type region 4. The integrated circuit may be represented as shown in FIG. 3 as a thyristor having a four region, two terminal NPNP trigger. The four region NPNP trigger is constituted by the lateral thyristor between the anode 14 and the control electrode 13. Thus a triggering current path is provided extending substantially parallel to the surface 6 through the lateral thyristor constituted by the regions 10, 11, 3 and 4 between the control electrode 13 and the anode 14. In FIG. 3 the contact 12, the cathode is designated C, and the contact 14, the anode, is designated A and the control electrode 13 is designated H. The lateral thyristor provides for switching the transverse thyristor formed by the four regions 1, 2, 3 and 4 and the three PN junctions $J_1$, $J_2$ and $J_3$ therebetween from a high impedance, nonconductive state to a low impedance, conductive state at a suitable applied voltage to the control electrode with respect to the anode voltage. This integrated circuit can thus be employed, for example in some motor speed control circuits. The operation of the circuit is as follows:

When the applied voltage between the anode 14 and cathode 12 is such that the anode is positive with respect to the cathode, the junctions $j_1$ and $J_3$ will be forwardly biased and the junction $J_2$ reverse biased. A depletion layer will be associated with the junction $J_2$ and will extend in the region 3. Provided the reverse bias of the junction $J_2$ is not greater than the reverse breakdown voltage of this junction, the transverse thyristor will remain in a high impedance, nonconductive state. When the applied voltage on the control electrode 13 is the same as that on the anode, the lateral thyristor is in the nonconductive state but when the voltage on the control electrode 13 is made negative with respect to the anode voltage, the junction $J_4$ is forward biased and the junction $J_5$ reverse biased. As the voltage on the control electrode becomes more negative with respect to the anode voltage the reverse bias across the junction $J_5$ increases and at a voltage difference between the anode and the control electrode of, for example 10 volts, the depletion layer associated with the junction $J_5$ extends across the region 3 towards the closely adjoining part of the junction $J_3$ adjacent the surface 6. The lateral thyristor is then switched to a low impedance-conductive state. It will be appreciated that in the vicinity of the surface 6 the junctions $J_2$ and $J_5$ are spaced by a sufficient distance, that is approximately 200 microns, such that the depletion layers associated with these reverse biased junctions extending in the region 3 do not meet with such a voltage applied to the control electrode. The switching-on of the lateral thyristor causes more holes to be injected across the remainder of the forward biased junction $J_3$ into the N-type region 3. Some of these holes reach the depletion layer associated with the junction $J_2$ and they will be accelerated across the depletion region and will reach $J_1$. Here they will cause the emission of electrons which are accelerated across the depletion region associated with $J_2$ and finally reach $J_3$, where they give rise to the emission of more holes. The current in the transverse thyristor will thus build up in the normal regenerative manner associated with thyristor turn-on and the transverse thyristor switched to a low impedance, conductive state.

FIG. 4 shows an equivalent circuit of the integrated circuit shown in FIGS. 1 and 2. It is common practice to represent a four layer thyristor as two transistors $T_1$ and $T_2$ in which the base of the PNP transistor $T_1$ is connected to the collector of the NPN transistor $T_2$ and the collector of the PNP transistor $T_1$ is connected to the base of the NPN transistor $T_2$. FIG. 4 shows the transistors $T_1$ and $T_2$ of the transverse thyristor constituted by the four regions 1, 2, 3 and 4, the cathode C of the transverse thyristor being the ohmic contact 12 on the region 1 which is the emitter of the NPN transistor $T_2$ and the anode A of the transverse thyristor being the ohmic contact 14 on the region 4 which is the emitter of the PNP transistor $T_1$. The lateral NPNP thyristor is associated with the region of the transverse thyristor on which the anode is present and is constituted by the four regions 10, 11, 3 and 4. The lateral thyristor is similarly shown as transistors $T_3$ and $T_4$, in which the control electrode is the ohmic contact 13 on the region 10 which is the emitter of the NPN transistor $T_3$ and the anode of the lateral thyristor being the ohmic contact 14 on the region 4 which is also the emitter of the PNP transistor $T_4$. The emitter and base regions of the PNP transistors $T_1$ and $T_4$ are common, these regions respectively being the regions 4 and 3.

The operation of the integrated circuit with respect to the triggering of the transverse thyristor ($T_1$ and $T_2$) by the lateral thyristor $T_3$ and $T_4$) will now be described with reference to the equivalent circuit shown in FIG. 4. As the voltage on the control electrode becomes more negative with respect to that on the anode, transistors $T_3$ and $T_4$ are turned on, this corresponding to a voltage difference between the control electrode and the anode at which the depletion layer of junction $J_5$ extends towards the junction $J_3$ where these junctions are closely spaced near the surface 6. When the transistors $T_3$ and $T_4$ are both turned on, the collector current of Transistor $T_3$ flows to the base of $T_1$. This causes the collector current of $T_1$ to increase and flow to the base of $T_2$ thus increasing the collector current of $T_2$ and turning both $T_2$ and $T_1$ on.

Figure 5:
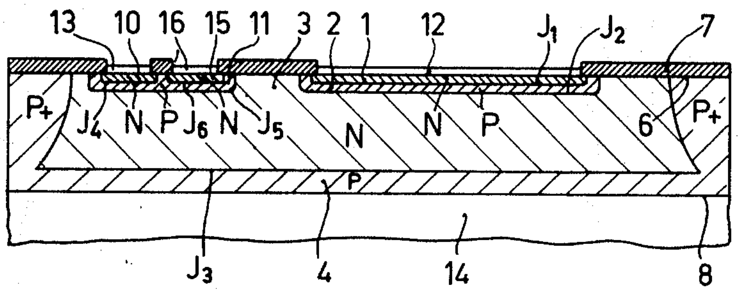
FIGS. 5 and 6 show in section and plan view respectively the semiconductor body of a semiconductor integrated circuit which is a modification of the semiconductor integrated circuit shown in FIGS. 1 and 2.
Figure 6:
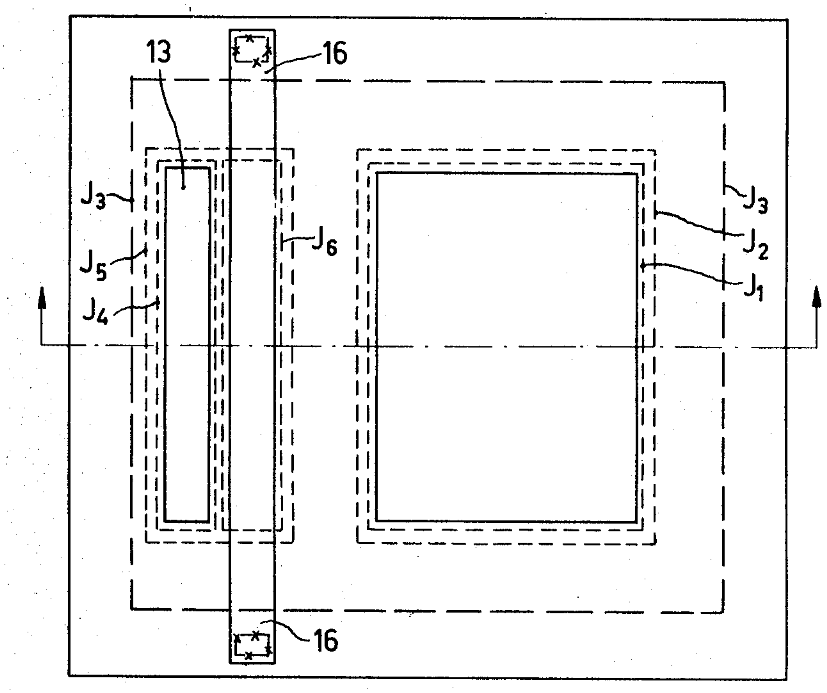

FIGS. 5 and 6 show an integrated circuit which is a modification of the integrated circuit shown in FIGS. 1 and 2, corresponding regions and junctions having the same reference numerals and letters. The modification resides in that the diffused P-type region 11 is of greater area and within this region there is a third further region consisting of a diffused N-type region 15 having the same impurity concentration profile as the N-type region 13, the latter two regions having been formed simultaneously with the N-type region 1 which also has the same impurity concentration profile. The PN junction $J_6$ between the N-type region 15 and the P-type region 11 terminates at the surface 6 below the silicon oxide layer 7. At an opening in the insulating layer 7 where the N-type region 15 extends to the surface 6, there is a metal layer 16 forming ohmic contact to this region and further extending over the insulating layer to a further opening therein where the P-type region 4 extends to the surface 6. The junction $J_6$ thus forms the junction of a Zener diode connected between the anode and the region 11 of the lateral thyristor (10, 11, 3, 4). The Zener diode serves to stabilize the turn-on voltage of the lateral thyristor.

The dimensions of the semiconductor body and the various regions shown in FIG. 5 and 6 are as follows:

The body is of 2.2 mm. × 2.0 mm. × 180 microns thickness. The N-type region 3 has a resistivity of approximately 25 ohm-cm. and its area extending at the surface 6 is 1.80 mm. × 1.60 mm. The P-type region 4 has been formed by a two-stage boron diffusion process and the surface concentration at the surfaces 6 and 8 is $10^{19}$ atoms/cc. The junction $J_3$ is at a distance from the surface 8 of 30 microns. The junctions $J_2$ and $J_5$ extend substantially parallel to the surface 6 at a distance therefrom of 30 microns. The P-type regions 2 and 11 have the same boron impurity concentration profiles and the surface concentration is $10^{18}$ atoms/cc. The P-type region 2 has an area at the surface 6 of 0.90 mm. × 1.20 mm. and the P-type region 11 has an area at the surface 6 of 460 microns × 1.20 mm. The junction $J_5$ is spaced from the junction $J_3$ where these junctions terminate at the surface 6, along one side of the P-type region 11, by a distance of approximately 40 microns. The adjacent parts of the junctions $j_5$ and $J_2$ where these junctions terminate at the surface 6 are spaced by a distance of 200 microns. The N-type regions 10 and 15 each have an area at the surface of 180 microns × 1.12 mm. The adjoining parts of the junctions $J_4$ and $J_6$ where these junctions terminate at the surface 6 are spaced by a distance of approximately 20 microns. The aluminum contact layer 13 has an area of 140 microns × 1.08 mm. and the aluminum contact layer 16 which is shown extending over the oxide layer 7 in contact with the region 4 at openings in the layer 7 (shown in chain-dot lines) has an area of 140 microns × 1.90 mm. The N-type regions 1, 10 and 15 have the same phosphorus impurity concentration profiles with the junctions $J_1$, $J_4$ and $J_6$ extending at a distance of 15 microns from the surface 6. The phosphorus surface concentration in the regions 1, 10 and 15 is $5\times10^{20}$ atoms/cc. The aluminum layers 12, 13 and 16 have a thickness of approximately 1 micron and the silicon oxide layer has a maximum thickness of approximately 2 microns.

FIG. 7 shows the equivalent circuit of the semiconductor integrated circuit shown in FIGS. 5 and 6. The circuit is identical to that shown in FIG. 4 with the addition of the Zener diode D between the anode A and the base of the NPN transistor $T_3$. Operation of the circuit with respect to the stabilization of the turn-on voltage of the lateral thyristor ($T_3$ and $T_4$) is as follows:

When the control electrode is biased negatively with respect to the anode A, provided the applied voltage does not exceed the reverse breakdown voltage of Zener diode D transistor $T_3$ and $T_4$ will be in the off-state. If the negative voltage applied between the control electrode and the anode exceeds the reverse breakdown voltage of diode D, this diode will go into reverse conduction and permit a current to flow to the base of $T_3$. This gives rise to collector current in $T_3$ which flows to the base of $T_4$ and these two transistors $T_3$ and $T_4$ are turned on regeneratively. Some of the collector current of $T_3$ will flow laterally to the base of $T_1$ and provided this is large enough transistors $T_1$ and $T_2$ will be turned on regeneratively. A low impedance path will thus be established between the anode and the cathode of the transverse thyristor ($T_1$ and $T_2$).

In the integrated circuit shown in FIGS. 8 and 9 the lateral thyristor is associated with the first region of the transverse thyristor. The integrated circuit comprises a semiconductor body of silicon having a first, N-type region 21, a second, P-type region 22, a third, N-type region 23 and a fourth, P-type region 24 extending between opposite major surfaces of the body and defining PN junctions $J_1$, $J_2$ and $J_3$ therebetween. The semiconductor body has a substantially plane surface 26 having an adherent protective insulating layer 27 of silicon oxide thereon. The first, N-type region 21 is a diffused region and is surrounded within the body by the second, P-type region 22 which is also a diffused region. The PN junction $J_1$ between the first and second regions terminates at the surface 26 below the silicon oxide layer 27. The second, P-type region 22 is surrounded within the body the third, N-type region 23, the PN junction $J_2$ between these regions also terminating at the surface 6 below the silicon oxide layer 27. The fourth, P-type region 24 is a diffused region and extends in the body from the opposite substantially plane surface 28. The region 24 further extends to the surface 26 at the periphery of the body such that the PN junction $J_3$ between the third and fourth regions 23 and 24 respectively also terminates at the surface 26 below the silicon oxide layer 27. A first further region 30 which is a diffused P-type region extends in the body from the surface 26 and is surrounded within the body by a second further region 31 which is a diffused N-type region with the PN junction $J_4$ between these regions also terminating at the surface 26 below the silicon oxide layer 27. The N-type region 31 extends to the surface 26 and is surrounded within the body by the second, P-type region 22 with the PN junction $J_5$ between these regions also terminating at the surface 26 below the silicon oxide layer 27. The part of the junction $J_5$ extending to the surface 26 adjacent the part of the junction $J_1$ extending to the surface 26 is spaced therefrom by a distance of approximately 40 microns. In the insulating layer 27 there are openings exposing the first, N-type region 21 and the first further, P-type region 30 where these regions extend to the surface 26. The openings contain aluminum layers 32 and 33 which form low resistance ohmic contacts with the regions 21 and 30 respectively. The semiconductor body is mounted with the surface 28 secured to a metal support 34 which forms a low resistance ohmic contact to the fourth, P-type region 24.

The regions 21, 22, 23 and 24 between the contacts 32 and 34 and the three PN junctions $J_1$, $J_2$ and $J_3$ therebetween constitute the main current path of a transverse thyristor, the contacts 32 and 34 constituting the main current carrying electrodes and respectively constituting the cathode and the anode of the transverse thyristor. The ohmic contact 33 on the P-type region 30 constitutes a control electrode. A lateral thyristor is present which is associated with the first, N-type region 32 and is constituted by the four successively arranged regions of alternating conductivity type near the surface 26 consisting of the P-type region 30, the N-type region 31, the P-type region 22 and the N-type region 21.

The dimension of the semiconductor body and the various regions shown in FIGS. 8 and 9 are as follow:

The body is of 2.0 mm. × 2.0 mm. × 180 microns thickness. The N-type region 23 has a resistivity of approximately 25 ohm-cm. and its area extending at the surface is 1.60 mm. × 1.60 mm. The P-type region 24 has been formed by a two-stage boron diffusion process and the surface concentration at the surfaces 26 and 28 is $10^{18}$ atoms/cc. The junction $J_3$ is at a distance from the surface 28 of 30 microns. The P-type region 22 has an area at the surface 26 of 1.20 mm. × 1.20 mm. and a diffused boron surface concentration of $10^{18}$ atoms/cc. The junction $J_2$ extends substantially parallel to the surface 26 at a distance therefrom of 30 microns. The N-type region 21 has an area at the surface 26 of 0.86 mm. × 1.16 mm. The N-type region 31 has an area at the surface 26 of 0.26 mm. × 1.16 mm. The N-type regions 21 and 31 have the same diffused phosphorus concentration profiles with surface concentrations of $10^{19}$ atoms/cc. The parts of the junctions $J_1$ and $J_5$ extending substantially parallel to the surface 26 are at a distance therefrom of 15 microns. The adjoining parts of the junctions $J_1$ and $J_5$ where these junctions terminate at the surface 26 are spaced by a distance of 40 microns. The P-type region 30 has an area at the surface 26 of 0.18 mm. × 1.08 mm. and a diffused boron surface concentration of $10^{20}$ atoms/cc. The junction $J_4$ extends at a depth of approximately 8 microns from the surface 26. The aluminum contact layer 32 has an area of 0.80 mm. × 1.10 mm. and the aluminum contact layer 33 has an area of 0.14 mm. × 1.04 mm. The aluminum layers 32 and 33 have a thickness of approximately 1 micron and the silicon oxide layer has a maximum thickness of approximately 2 microns.

Figures 10, 11:
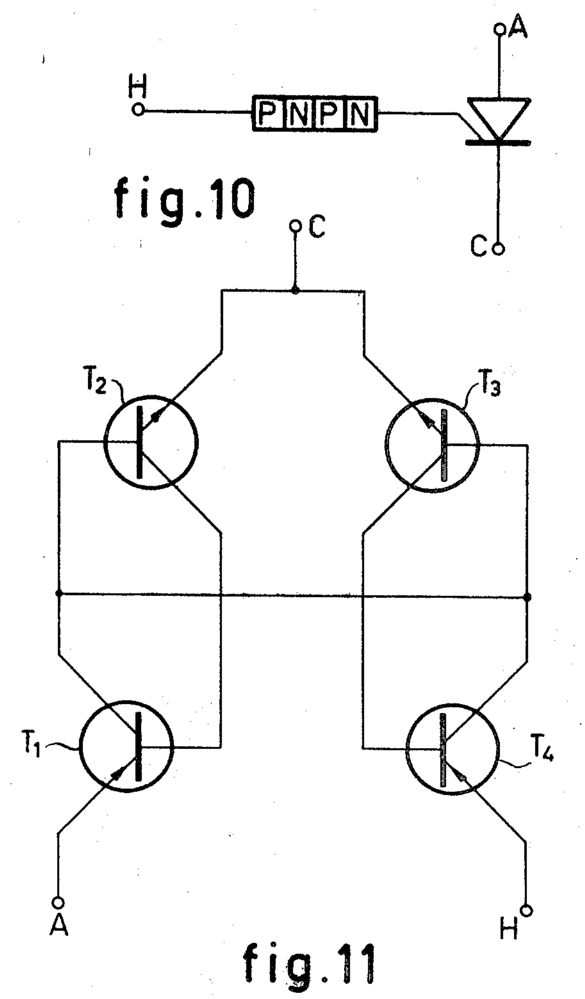
FIG. 10 is a schematic form of the semiconductor integrated circuit shown in FIGS. 8 and 9.
FIG. 11 is a representation of the equivalent circuit of the semiconductor integrated circuit shown in FIGS. 8 and 9.

The integrated circuit may be represented as shown in FIG. 10 as a thyristor having a four region, two terminal PNPN trigger. The four region PNPN trigger is constituted by the lateral thyristor between the cathode 32 and the control electrode 33. Thus a triggering current path is provided extending substantially parallel to the surface 26 through the lateral thyristor constituted by the regions 30, 31, 22 and 21 between the control electrode 33 and the cathode 32. In FIG. 10 the contact 32, the cathode is designated C the contact 34, the anode is designated A and the control electrode 33 is designated H. The lateral thyristor provides for switching the transverse thyristor formed by the four regions 21, 22, 23 and 24 and the three PN junctions $J_1$, $J_2$ and $J_3$ therebetween from a high impedance, nonconductive state to a low impedance conductive state at a suitable applied voltage to the control electrode with respect to the cathode voltage.

The operation of the circuit is as follows:

When the applied voltage between the anode 34 and the cathode 32 is such that the anode is positive with respect to the cathode, the junctions $J_1$ and $J_3$ will be forwardly biased and the junction $J_2$ reverse biased. A depletion layer will be associated with the junction $J_2$ and will extend in the region 23. Provided the reverse bias of the junction $J_2$ is not greater than the reverse breakdown voltage of this junction, the transverse thyristor will remain in a high impedance, nonconductive state. When the applied voltage on the control electrode 33 is the same as that on the cathode 32, the lateral thyristor is in the nonconductive state but when the voltage on the control electrode 33 is made positive with respect to the cathode voltage, the junction $J_4$ is forward biased and the junction $J_5$ reverse biased. As the voltage on the control electrode 33 becomes more positive with respect to the cathode voltage, the reverse bias across the junction $J_5$ increases and at a voltage difference between the cathode and the control electrode of, for example, 10 volts, the depletion layer associated with the junction $J_5$ extends across the region 22 towards the closely adjoining part of the junction $J_1$ adjacent the surface 26. The lateral thyristor is then switched to a low impedance, conductive state. The switching-on of the lateral thyristor causes more electrons to be injected across the remainder of the forward biased junction $J_1$ into the P-type region 22. Some of these electrons reach the depletion layer associated with the junction $J_2$ and are accelerated across it and finally arrive at junction $J_3$. Here they will give rise to the emission of holes from the P-type region 24 into the N-type region 23 which will be accelerated across the depletion layer associated with $J_2$ and will arrive at the junction $J_1$. These holes will give rise to the emission of more electrons from the N-type region 21 into the P-type region 22 and the current through the transverse thyristor will increase by the normal regenerative turn-on process associated with thyristors.

FIG. 11 shows an equivalent circuit of the integrated circuit shown in FIGS. 8 and 9. This circuit is represented in a manner similar to that of FIG. 4 in which a thyristor is represented as two transistors. FIG. 11 shows the transistors $T_1$ and $T_2$ of the transverse thyristor constituted by the four regions 21, 22, 23 and 24, the cathode C of the transverse thyristor being the ohmic contact 32 on the region 21 which is the emitter of the NPN transistor $T_2$ and the anode A of the transverse thyristor being the ohmic contact 34 on the region 24 which is the emitter of the PNP transistor $T_1$. The lateral PNPN thyristor associated with the N-type region 21 of the transverse thyristor and constituted by the four regions 30, 31, 22 and 21 is similarly shown as transistors $T_3$ and $T_4$. The control electrode is the ohmic contact 33 on the region 30 which is the emitter of the PNP transistor $T_4$. The emitter and base regions of the NPN transistors $T_2$ and $T_3$ are common, these regions respectively being the regions 21 and 22.

The operation of the integrated circuit with respect to the triggering of the transverse thyristor ($T_1$ and $T_2$) by the lateral thyristor ($T_3$ and $T_4$) will now be described with reference to the equivalent circuit shown in FIG. 11. As the voltage on the control electrode becomes more positive with respect to that on the cathode, transistors $T_3$ and $T_4$ are turned on, this corresponding to a voltage difference between the cathode and the control electrode at which the depletion layer of the junction $J_5$ extends towards the junction $J_1$ where these junctions are closely spaced near the surface 26. When the transistors $T_3$ and $T_4$ are both turned on, the collector current of transistor $T_4$ flows to the base of $T_2$. This causes the collector current of $T_2$ to increase and flow to the base of $T_1$ thus increasing the collector current of $T_1$ and turning both $T_2$ and $T_1$ on.

FIGS. 12 and 13 show an integrated circuit which is a modification of the integrated circuit shown in FIGS. 8 and 9, corresponding regions and junctions having the same reference numerals and letters. The modification resides in that the diffused N-type region 31 is of greater area and within this region there if a third further region consisting of a diffused P-type region 35 having the same impurity concentration profile as the P-type region 30. The PN junction $J_6$ between the P-type region 35 and the N-type region 31 terminates at the surface 26 below the silicon oxide layer 27. At an opening in the insulating layer 27 where the P-type region 35 extends to the surface 26, there is a metal layer 36 forming ohmic contact to this region and further extending over the insulating layer in contact with the metal layer 32 constituting the cathode of the transverse thyristor. The junction $J_6$ thus forms the junction of a Zener diode connected between the cathode and the region 31 of the lateral thyristor (30, 31, 22 and 21). The Zener diode serves to stabilize the turn-on voltage of the lateral thyristor.

The dimensions of the semiconductor body and the various regions shown in FIGS. 12 and 13 are as follows:

The body is of 2.2 mm. × 2.0 mm. × 180 microns thickness. The N-type region 23 has a resistivity of approximately 25 ohm-cm. and its area extending at the surface 26 is 1.60 mm. × 1.60 mm. The P-type region 24 has been formed by a two-stage boron diffusion process and the surface concentration at the surfaces 26 and 28 is $10^{18}$ atoms/cc. The junction $J_3$ is at a distance from the surface 28 of 30 microns. The P-type region 22 has an area at the surface 26 of 1.22 mm. × 1.22 mm. and a diffused boron surface concentration of $10^{18}$ atoms/cc. The junction $J_2$ extends substantially parallel to the surface 26 at a distance therefrom of 30 microns. The N-type region 21 has an area at the surface 26 of 0.86 mm. × 1.18 mm. The N-type region 31 has an area at the surface 26 of 0.48 mm. × 1.18 mm. The N-type regions 21 and 31 have the same diffused phosphorus concentration profiles with surface concentrations of $10^{19}$ atoms/cc. The parts of the junctions $J_1$ and $J_5$ extending substantially parallel to the surface 26 are at a distance therefrom of 15 microns. The adjoining parts of the junctions $J_1$ and $J_5$ where they terminate at the surface 26 are spaced by a distance of 40 microns. The P-type regions 30 and 35 each have an area at the surface 26 of 0.18 mm. × 1.08 mm. and have the same diffused boron concentration profiles, the surface concentrations being $10^{20}$ atoms/cc. The junctions $J_4$ and $J_6$ extend at a depth of approximately 8 microns from the surface 26. The adjoining parts of the junctions $J_4$ and $J_6$ where they terminate at the surface 26 are spaced by a distance of 40 microns. The aluminum contact layer 32 has an area of 0.80 mm. × 1.12 mm. and is joined to the aluminum layer 36 by two strips extending above the oxide layer 27. The aluminum layer 33 has an area of 0.14 mm. × 1.04 mm. The aluminum layers 32, 33 and 36 have a thickness of approximately 1 micron and the silicon oxide layer 27 has a maximum thickness of approximately 2 microns.

FIG. 14 shows the equivalent circuit of the semiconductor integrated circuit shown in FIGS. 12 and 13. The circuit is identical to that shown in FIG. 11 with the addition of the Zener diode D between the cathode A and the base of the PNP transistor $T_4$. Operation of the circuit with respect to the stabilization of the turn-on voltage of the lateral thyristor ($T_3$ and $T_4$) is as follows:

When the control electrode is biased positively with respect to the cathode C, provided the applied voltage does not exceed the reverse breakdown voltage of the Zener diode D, transistor $T_3$ and $T_4$ will be in the off state. If the positive voltage applied to the control electrode with respect to the cathode exceeds the reverse breakdown voltage of the Zener diode D this diode will go into reverse conduction and permit a current to flow to the base of $T_4$. This gives rise to collector current flow in $T_4$ which flows to the base of $T_3$ and these two transistors are turned on regeneratively. Some of the collector current of the $T_4$ will flow laterally to the base of $T_1$ and provided this is large enough transistors $T_1$ and $T_2$ will be turned on regeneratively. A low impedance path will thus be established between the anode A and the cathode C of the transverse thyristor ($T_1$ and $T_2$).

What We claim is:

1. A semiconductor integrated circuit of the planar type comprising a semiconductor body having a transverse thyristor formed by first, second, third and fourth successively arranged regions of alternating conductivity type extending between opposite major surfaces of the body and defining three PN junctions therebetween, two main current carrying electrodes, one of said main electrodes being in ohmic connection with the first region of the one conductivity type at one major surface and the other of said main electrodes being in ohmic connection with the fourth region which is of the opposite conductivity type whereby a main current carrying path is provided between said electrodes through the transverse thyristor formed by said four regions and said three PN junctions and extending transversely to the major surfaces and through the body, the said first region being completely surrounded within the body by the said second region with the PN junction therebetween terminating at the one surface, first and second further regions of alternating conductivity type provided within the body extending from the said one surface, said second further region completely surrounding said first further region forming a PN junction therebetween also terminating at the said one surface, an insulating layer on the said one surface covering the PN junctions terminating thereat, said first further and said second further regions forming with one of the first and fourth regions and the second region in the case of the first and the third region in the case of the fourth four successively arranged regions alternating in conductivity type forming a triggering lateral thyristor having a triggering current path extending substantially parallel to said one surface, a control electrode in ohmic connection with the first further region at the one surface thereby to provide a lateral thyristor for switching the transverse thyristor from a high-impedance, nonconductive state to a low-impedance, conductive state, a third further region of the same conductivity type as the first further region provided within the second further region and completely surrounded by the latter with the PN junction formed with the latter terminating at the said one surface underneath the insulating layer, and means connecting said third further region to the fourth region to thereby provide a Zener diode to stabilize the turn-on voltage of the lateral thyristor.

2. A semiconductor integrated circuit as set forth in claim 1 wherein each of the first and second regions comprise diffused regions having an impurity distribution decreasing from the said one surface into the bulk of the body, said third region completely surrounding the second region, and said fourth region completely surrounding the third region, the PN junctions between the third and second regions and between the fourth and third regions terminating at the said one surface underneath the insulating layer.

3. A semiconductor integrated circuit as set forth in claim 1 wherein the third further region and the first further region are each diffused regions having the same impurity distribution decreasing from the said one surface into the bulk.

4. A semiconductor integrated circuit of the planar type comprising a semiconductor body having a transverse thyristor formed by first, second, third and fourth successively arranged regions of alternating conductivity type extending between opposite major surfaces of the body and defining three PN junctions therebetween, two main current carrying electrodes, one of said main electrodes being in ohmic connection with the first region of the one conductivity type at one major surface and the other of said main electrodes being in ohmic connection with the fourth region which is of the opposite conductivity type whereby a main current carrying path is provided between said electrodes through the transverse thyristor formed by said four regions and said three PN junctions and extending transversely to the major surface and through the body, the said first region being completely surrounded within the body by the said second region with the PN junction therebetween terminating at the one surface, each of the first and second regions comprising diffused regions having an impurity distribution decreasing from the said one surface into the bulk of the body, said third region completely surrounding the second region, said fourth region completely surrounding the third region, the PN junctions between the third and second regions and between the fourth and third regions terminating at the said one surface underneath the insulating layer, first and second further regions of alternating conductivity type provided within the second region and being diffused regions with said second further region having an impurity distribution the same as that of the first region, said second further region completely surrounding said first further region forming a PN junction therebetween also terminating at the said one surface, an insulating layer on the said one surface covering the PN junctions terminating thereat, said first further and said second further regions forming with the first and second regions four successively arranged regions alternating in conductivity type forming a triggering lateral thyristor having a triggering current path extending substantially parallel to said one surface, a control electrode in ohmic connection with the first further region at the one surface thereby to provide a lateral thyristor for switching the transverse thyristor from a high-impedance, nonconductive state to a low-impedance, conductive state, a third further surface region of the same conductivity type as the first further region provided within the second further region and completely surrounded by the latter with the PN junction formed with the latter terminating at the said one surface underneath the insulating layer, and means connecting said third further region to the first region to thereby provide a Zener diode to stabilize the turn-on voltage of the lateral thyristor.

PO-1050
(5/69)

UNITED STATES PATENT OFFICE
CERTIFICATE OF CORRECTION

Patent No. 3586928 Dated June 22, 1971

Inventor(s) GERALD DAVID BERGMAN and TONY CHARLES DENTON

It is certified that error appears in the above-identified patent and that said Letters Patent are hereby corrected as shown below:

Col. 1, line 46, before "surface" insert -- one --.

Col. 2, line 25, "a" (second occurrence) should read -- the --.

Col. 3, line 13, "PN" should read -- region --.

Col. 9, line 45, after "body" insert -- by --.

Col. 10,
line 12, "follow" should read -- follows --.

Col. 11, line 58, "if" should read -- is --.

Col. 14, line 7, "surface" should read -- surfaces --.

Signed and sealed this 8th day of February 1972.

(SEAL)
Attest:

EDWARD M.FLETCHER,JR.
Attesting Officer

ROBERT GOTTSCHALK
Commissioner of Patents